US007954235B2

(12) United States Patent
Martauz et al.

(10) Patent No.: US 7,954,235 B2
(45) Date of Patent: Jun. 7, 2011

(54) METHOD OF MAKING A SEAL ABOUT A COPPER-BASED TERMINAL

(75) Inventors: Francis D. Martauz, Canfield, OH (US); Mark A. Scheel, Canfield, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/582,158

(22) Filed: Oct. 20, 2009

(65) Prior Publication Data

US 2011/0067239 A1 Mar. 24, 2011

Related U.S. Application Data

(63) Continuation-in-part of application No. 12/575,675, filed on Oct. 8, 2009.

(60) Provisional application No. 61/243,650, filed on Sep. 18, 2009.

(51) Int. Cl.
*H05K 13/00* (2006.01)

(52) U.S. Cl. ............. 29/855; 29/857; 29/858; 174/84 C; 439/86; 439/203

(58) Field of Classification Search .................... 29/855, 29/857, 858; 174/84 C; 439/86, 203
See application file for complete search history.

(56) References Cited

U.S. PATENT DOCUMENTS 2,815,497 A * 12/1957 Redslob ........................ 439/203
2,901,722 A * 8/1959 Arnott, Jr. ..................... 439/203
3,243,758 A * 3/1966 Frant et al. .................... 439/519
3,985,951 A * 10/1976 Harris ........................ 174/138 F
4,214,121 A * 7/1980 Charneski et al. .......... 174/84 C
4,888,070 A * 12/1989 Clark et al. ...................... 156/48
4,963,698 A * 10/1990 Chang et al. ................ 174/77 R
5,140,746 A * 8/1992 Debbaut ......................... 29/855
5,357,057 A * 10/1994 Debbaut ..................... 174/84 R
5,536,186 A 7/1996 Watanabe
5,639,992 A * 6/1997 Debbaut ..................... 174/84 R
5,672,846 A * 9/1997 Debbaut ..................... 174/84 R
5,868,590 A 2/1999 Dobbelaere
5,980,318 A 11/1999 Morello et al.
6,257,931 B1 7/2001 Sakurai et al.
6,322,401 B2 11/2001 Suzuki
6,354,873 B1 3/2002 Morello et al.
6,375,502 B2 4/2002 Yoshida et al.
6,869,312 B2 3/2005 Hasebe
7,160,150 B2 1/2007 Annequin
7,207,841 B2 4/2007 Machida et al.
7,371,132 B2 5/2008 Tanaka
7,422,480 B1 9/2008 Musick et al.
7,438,585 B2 10/2008 Morello
2002/0076996 A1 6/2002 Murakami et al.

* cited by examiner

*Primary Examiner* — C. J Arbes
(74) *Attorney, Agent, or Firm* — Jimmy L. Funke

(57) ABSTRACT

A method of forming a seal about an electrically conductive core of a cable having an insulative outer cover and a terminal includes the steps of providing a lead of the core extending beyond an axial edge of the insulative outer cover; applying a conformal coating onto the lead; crimping the terminal onto the cable while the conformal coating is still wet to displace the conformal coating from between the lead and the abutting contact surfaces of the terminal and to cover and seal remaining portions of the lead not in direct contact with the terminal with the conformal coating and curing the conformal coating over the remaining portions of the lead.

16 Claims, 3 Drawing Sheets

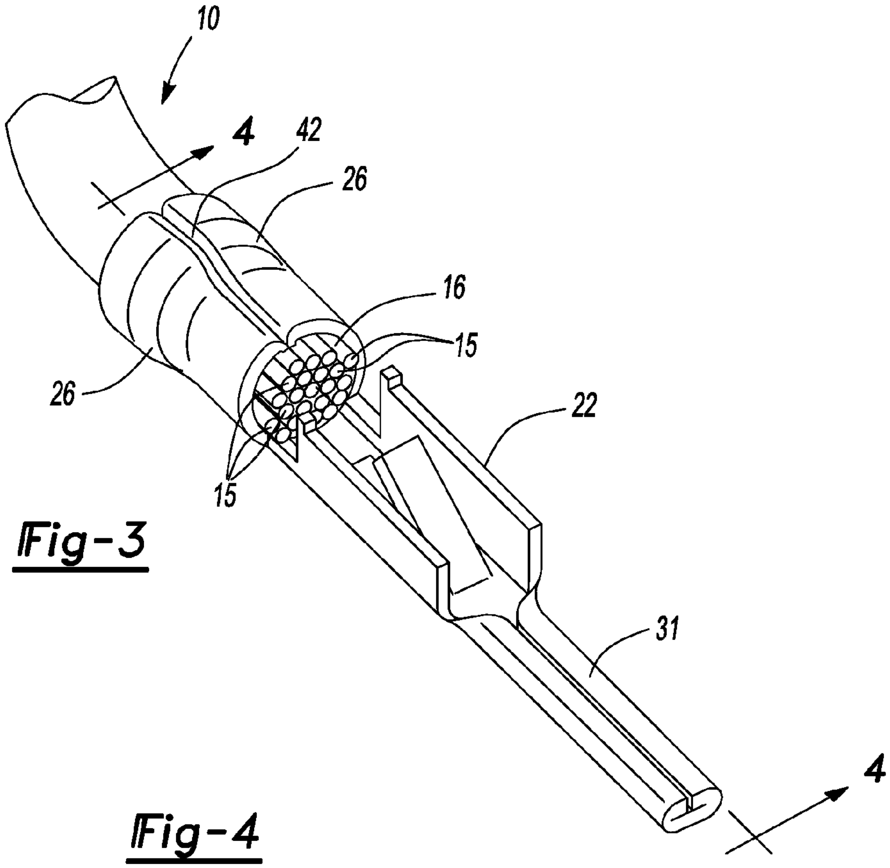
Fig-3
Fig-4
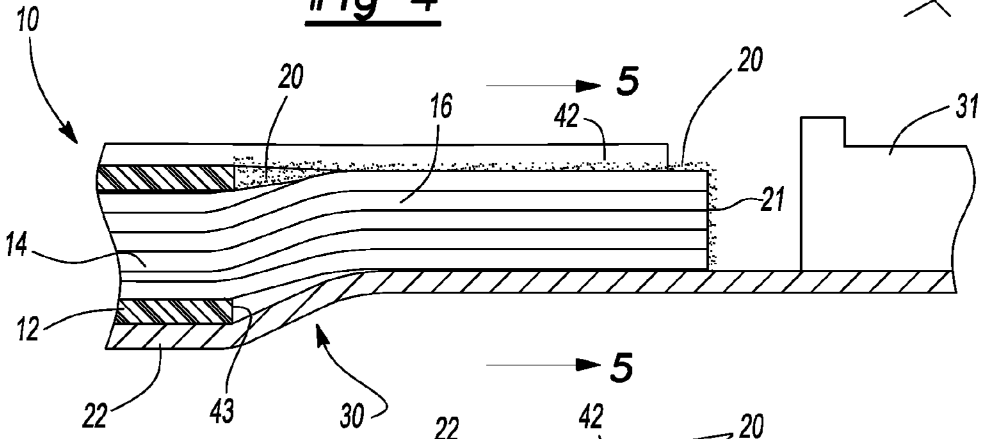
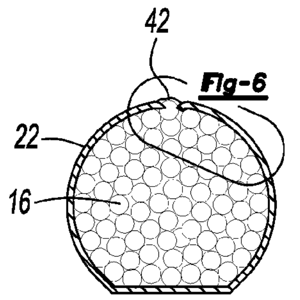
Fig-5
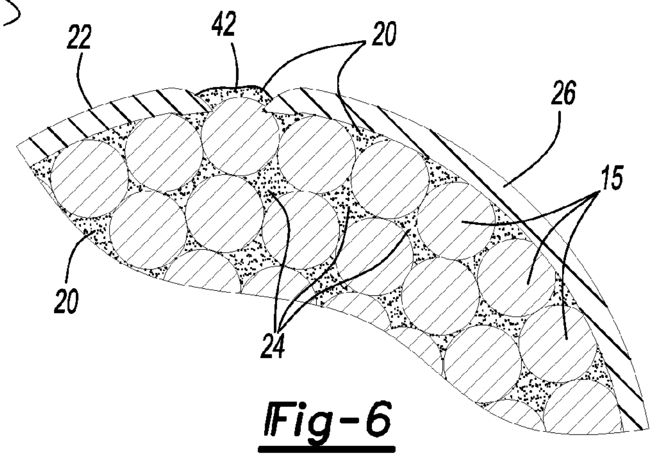
Fig-6

Fig-7
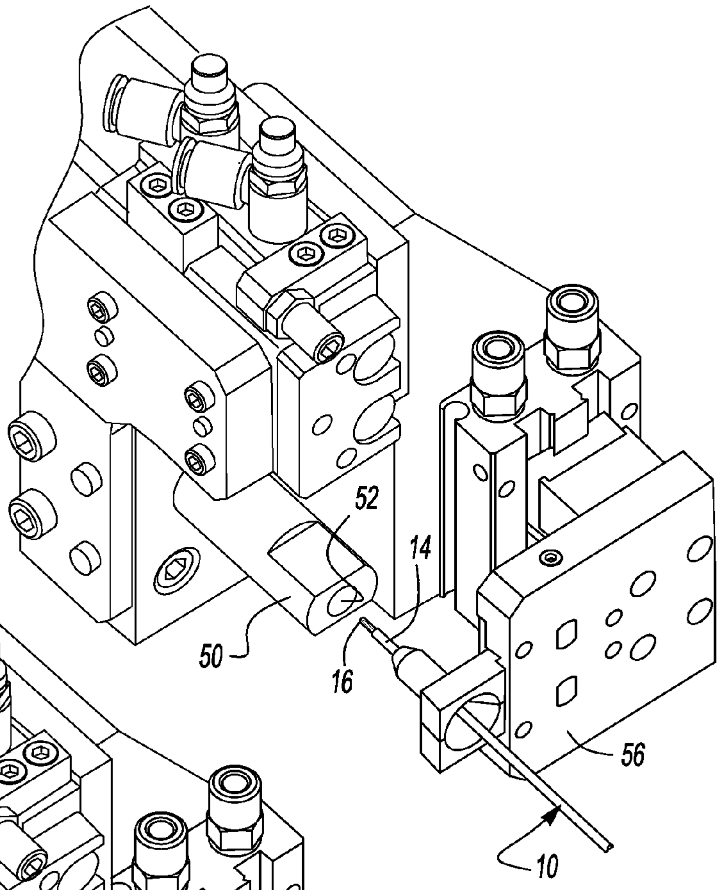
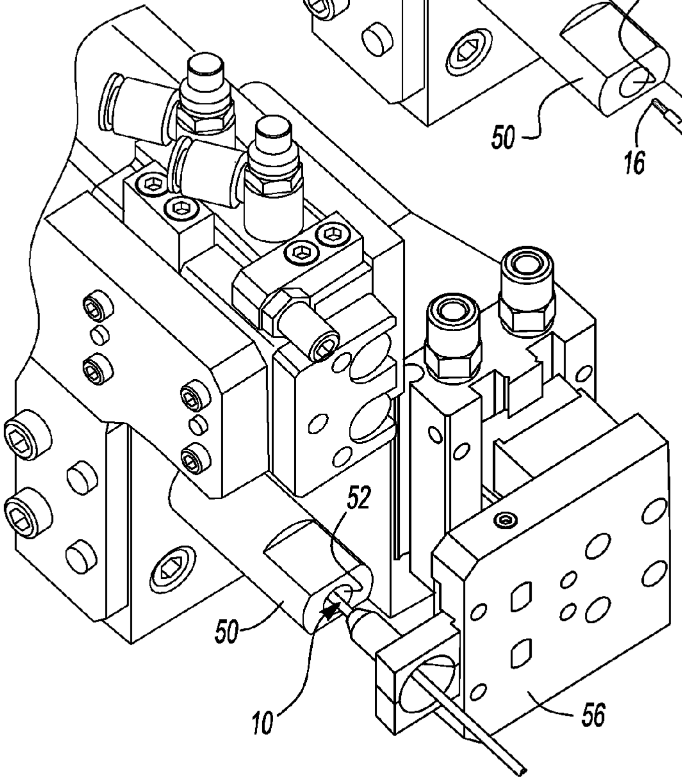
Fig-8
Fig-9
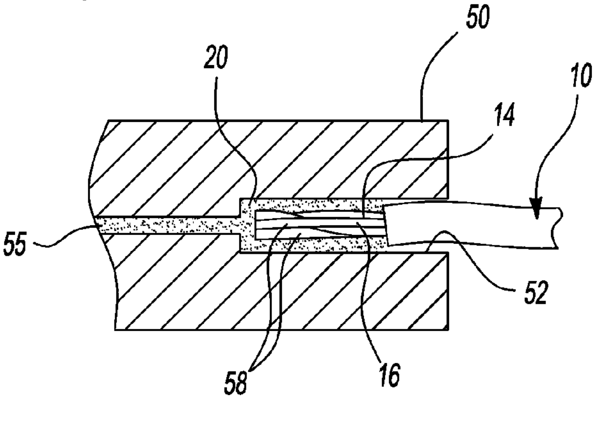

METHOD OF MAKING A SEAL ABOUT A COPPER-BASED TERMINAL

CROSS-REFERENCE TO CLAIM OF PRIORITY

This application is a continuation-in-part of co-pending U.S. application Ser. No. 12/575,675 filed on Oct. 8, 2009 and claims priority of U.S. Provisional Application Ser. No. 61/243,650 filed Sep. 18, 2009.

TECHNICAL FIELD

The field of this invention relates to a connection between an aluminum based cable and a copper based electrical terminal.

BACKGROUND OF THE DISCLOSURE

Insulated copper based cable is commonly used for automotive wiring. Copper has high conductivity, good corrosion resistance and adequate mechanical strength. However, copper and copper based metals are relatively expensive metals and are also heavy.

Interest is weight savings and cost savings in automotive electrical wiring applications have made aluminum based cables an attractive alternative to copper based wires. However, some wiring and electrical connectors may remain copper based. Thus, there may be a transition somewhere in the electrical circuit between an aluminum based portion of the circuit and a copper based portion of the circuit. Often this transition may occur at the terminal because the terminal may remain copper based for reasons of size and complexity of shape that can be more easily achieved with copper based materials over aluminum based materials. The connection of aluminum based cable to a copper based terminal can produce a galvanic corrosion of the aluminum, if an electrolyte, for example salt water, is present. The galvanic reaction corrodes the aluminum because the aluminum or aluminum alloy has a different galvanic potential than the copper or copper alloys of the terminals. “Copper based” as used in this document means pure copper, or a copper alloy where copper is the main metal in the alloy. Similarly, “aluminum based” as used in this document means pure aluminum or an aluminum alloy where aluminum is a main metal in the alloy.

Referring now to FIG. 1, significant corrosion is known to occur between dissimilar materials when an electrolyte such as salt water is present. A conventional copper based terminal 35 as shown in FIG. 1 has a pair of insulator wings 36 and a pair of core wings 38 with a notch 40 therebetween. A stranded aluminum based cable 12 may have its connected exposed strand ends 15 of lead 16 substantially corrode when it is attached to a terminal 35 made from a more noble metal such as pure copper, brass, or another copper alloy. A four day long salt fog test has been demonstrated to substantially corrode away almost the entire aluminum lead 16. The notch 40 allows greater access of the salt and other electrolytes to contact the exposed strands 15. The lead 16 when corroded completely away causes a break in the electrical connection between the cable 12 and the terminal 35.

What is needed is an improved corrosion resistant connection between a cable and its connected terminal. What is also needed is a connection between aluminum based cable and copper based terminals with improved corrosion resistance through an improved seal to seal the aluminum cable from an electrolyte while maintaining electrical contact with the terminal.

SUMMARY OF THE DISCLOSURE

In accordance with one aspect of the invention, a method of forming a seal about an aluminum based core of a cable that has an insulative outer cover and a copper based terminal includes the steps of providing a lead of the core extending beyond an axial edge of the insulative outer cover; applying a conformal coating onto the lead; crimping the copper based terminal onto the lead while the conformal coating is still wet to displace the conformal coating from between the lead and the abutting contact surfaces of the copper based terminal to provide electrical contact through the interface between the lead and the terminal and to cover and seal remaining portions of the lead not in direct contact with the terminal; and curing the conformal coating over the remaining portions of the lead.

Preferably, applying of the conformal coating is by dipping the lead into a nozzle. The conformal coating is dispensed into the nozzle while the lead is in the nozzle. In one embodiment, the aluminum based core of the cable is made from a plurality of strands that having spaces therebetween. The conformal coating is dispensed into the nozzle with sufficient pressure to fill the spaces with the wet conformal coating before curing. In one embodiment, the nozzle is horizontally dispensed and the lead horizontally moves into said nozzle for dipping and horizontally out from the nozzle carrying conformal coating with it.

The terminal preferably has a combination insulation and core wing that is crimped over the insulative outer cover and spans over an edge of the insulative outer cover and crimped onto the lead of the core when the conformal coating is still wet.

In accordance with another aspect of the invention, a method of forming a seal about an electrically conductive core of a cable with an insulative outer cover and a terminal includes providing the steps of a lead of the core extending beyond an axial edge of the insulative outer cover; applying a conformal coating onto the lead; crimping the terminal onto the cable while the conformal coating is still wet to displace the conformal coating from between the lead and the abutting contact surfaces of the terminal to provide electrical contact through the interface of the terminal and lead and to cover and seal remaining portions of the lead not in direct contact with terminal with the conformal coating; and curing the conformal coating over the remaining portions of the lead.

Preferably, applying of the conformal coating is by dipping the lead into a nozzle. The conformal coating is dispensed while the lead is in the nozzle. Preferably, the core is made from a material more electrically negative than the terminal when exposed to an electrolyte.

In accordance with another aspect of the invention, a method of forming a seal about an aluminum based core of a cable that has an insulative outer cover and a copper based terminal includes the steps of providing a lead of the core extending beyond an axial edge of the insulative outer cover; spraying a conformal coating onto the lead; crimping the copper based terminal onto the lead while the conformal coating is still wet to displace the conformal coating from between the lead and the abutting contact surfaces of the copper based terminal to provide electrical contact through the interface between the lead and the terminal and to cover and seal remaining portions of the lead not in direct contact with the terminal; and curing the conformal coating over the remaining portions of the lead.

Preferably, the spraying of the conformal coating is in the direction axially from the cable toward the distal end of the lead to provide the conformal coating to flow off the distal end of the lead.

In one embodiment, the aluminum based core of the cable is made from a plurality of strands that when crimped, have voids therebetween which are filled with the wet conformal coating before curing. The terminal has a combination insulation and core wing that is crimped over the insulative outer cover and spans over an edge of the insulative outer cover and crimped onto the lead of the core when the conformal coating is still wet.

In accordance with another aspect of the invention, a method of forming a seal about an electrically conductive core of a cable with an insulative outer cover and a terminal includes providing the steps of a lead of the core extending beyond an axial edge of the insulative outer cover; spraying a conformal coating onto the lead; crimping the terminal onto the cable while the conformal coating is still wet to displace the conformal coating from between the lead and the abutting contact surfaces of the terminal to provide electrical contact through the interface of the terminal and lead and to cover and seal remaining portions of the lead not in direct contact with terminal with the conformal coating; and curing the conformal coating over the remaining portions of the lead.

Preferably, the spraying of the conformal coating is in the direction axially from the cable toward a distal end of the lead to provide the conformal coating to cover the lead and flow off the distal end of the lead.

In one embodiment, the cable is made from a plurality of strands; and the strands, when crimped, have voids therebetween which are filled with the wet conformal coating before curing. The terminal has a combination insulation and core wing that is crimped over the insulative outer cover and spans over an edge of the insulative outer cover and crimped onto the lead of the core. The core is preferably made from a material more electrically negative than the terminal when exposed to an electrolyte.

BRIEF DESCRIPTION OF THE DRAWINGS

Reference now is made to the accompanying drawings in which:

FIG. 3 is a perspective view of the terminal and the aluminum based cable assembled onto the terminal;

FIG. 4 is a cross-sectional view taken along lines 4-4 shown in FIG. 3;

FIG. 5 is a cross-sectional view taken along lines 5-5 shown in FIG. 4;

FIG. 6 is an enlarged fragmentary view of FIG. 5;

FIG. 7 is a perspective view of a dip nozzle and lead before insertion of the lead into the dip nozzle;

FIG. 8 is a perspective view illustrating the lead horizontally moved and inserted into the dip nozzle; and FIG. 9 is an enlarged segmented view illustrating the lead in the dip nozzle.

DETAILED DESCRIPTION OF THE PREFERRED EMBODIMENT

Figure 2:
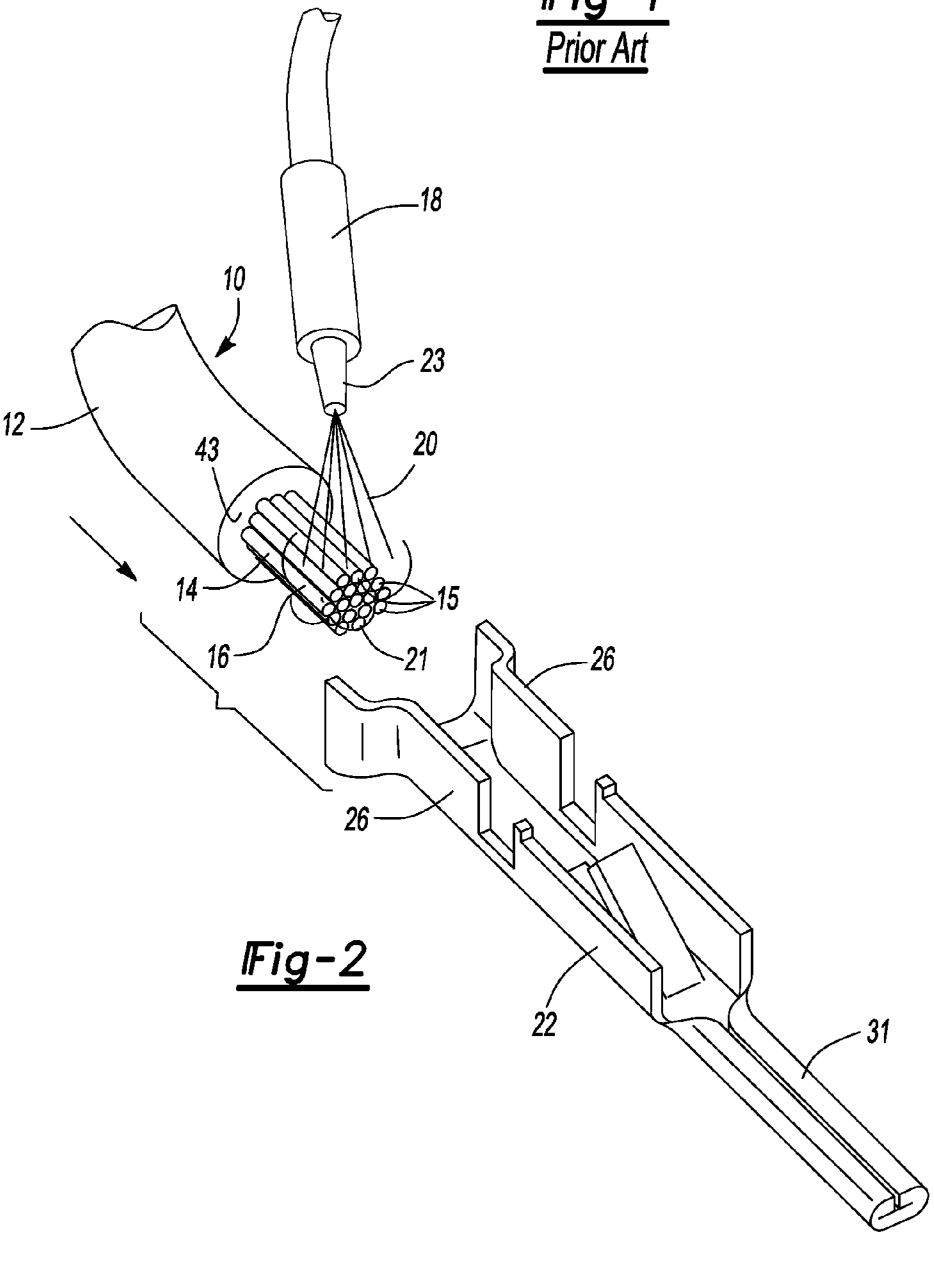
FIG. 2 is a perspective and exploded view of copper based terminal and the treated cable of FIG. 2 an aluminum based cable with its lead being removed of its insulative outer cover and undergoing a spray of conformal coating in the axial direction toward the exposed lead of the conductive cable core in accordance with one embodiment of the invention before assembly.

Referring to FIG. 2, a cable 10 has an insulative outer cover 12 and an aluminum based core 14. The core 14 is made of a plurality of individual strands 15 bundled and twisted together. An end portion of the insulative outer cover 12 is removed to expose a lead 16 of the core 14. A spray machine 18 sprays a conformal coating 20 onto the lead 16 of the core. The position of the spray head 23 is pointed to be directed away from cover 12 and toward the axial distal end 21 of the lead 16. The direction of the spray is axially directed away from the insulative outer cover 12 and toward the axial distal end 21. The spray head 23 may commence spraying the conformal coating 20 before the cable is moved into the spray of conformal coating 20. The cable is then moved axially into the spray such that axial ends 21 hit the spray and is coated with conformal coating 20. The cable may rotate or the spray head 18 may orbit about the cable 12 to assure the lead 16 is coated 360° around. As the cable is moved forward toward terminal 22, the spray head 23 may be axially aligned with the insulative outer cover 12 and provide conformal coating 20 over edge 43 of insulative outer cover 12. The entire lead 16 is coated.

While the conformal coating is still wet, the cable 10 is positioned relative to a terminal 22 as best shown in FIG. 3. The terminal 22 has a mating end 31. The terminal 22 is then crimped at its opposite end onto the cable 10 such that it makes electrical contact with the lead 16 of core 14 at best shown in FIGS. 4, 5 and 6.

As the terminal is crimped onto the cable 10, the conformal coating 20 on the lead 16 is displaced to allow direct contact between the terminal 22 and the lead 16. The conformal coating is displaced to fill voids 24 between the strands 15 as highlighted in FIG. 6, and other exposed surfaces of the lead 16 that are not in direct contact with the terminal 22, for example in an area 42 between the wings 26 and at the end 21 as best shown in FIG. 4. After the crimping of the terminal 22 onto the cable 10, the conformal coating is allowed to cure to complete the assembly of the electrical connection 30.

Figure 1:
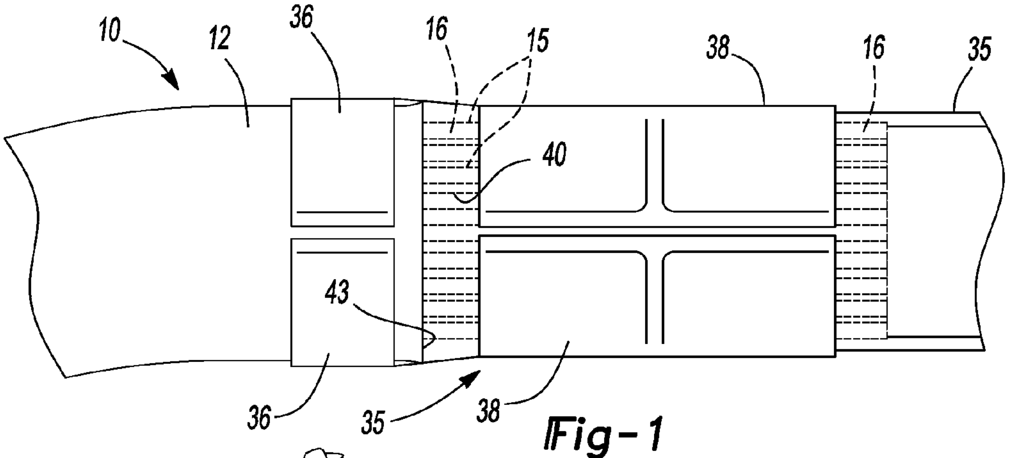
Fig-1 Prior Art
FIG. 1 is a plan view of a conventional prior art aluminum based cable and copper based terminal illustrating the exposed strand ends of the aluminum based wire in phantom that have been substantially corroded away.

The terminal 22 has wings 26 that eliminate the conventional notch 40 shown in FIG. 1. The wings 26 are crimped over the insulative outer cover 12 and span over an edge 43 of the insulative outer cover 12 and are crimped onto the lead 16. The wings 26 can be referred to as combination insulator and core wings.

Each wing 26 is crimped onto the lead 16 while the conformal coating 20 is still wet. The conformal coating 20 is displaced from the abutting surfaces of the terminal 22 and lead 16 to provide an electrical interface and connection between the terminal 22 and lead 16. The conformal coating 20 is displaced to areas of the lead 16 that are not in direct contact with the terminal, for example within the gap 42 formed between the crimped wings 26 and within the voids 24 and at the axial outer end 21 of the lead 16.

The conformal coating 20 is then cured in position to complete the electrical assembly 30.

Another modified method is illustrated in FIGS. 7, 8, and 9. The lead 16 of the core 14 faces a dip nozzle 50 as shown in FIG. 7. The dip nozzle 50 has a counterbore 52 which receives the lead 16 as shown in FIG. 8. FIG. 9 illustrates the conformal coating 20 while still wet being dispensed into the counterbore 52 from supply port 55 to dip the lead into the conformal coating 20. The high viscosity of conformal coating 20 allows the position of the nozzle 50 to be horizontally disposed. The conformal coating may be dispensed on to the lead before, simultaneously, or after the lead is inserted into the counterbore. The cable 10 and lead 16 are then horizontally retracted and the conformal coating 20 sticks to the lead 16 and is withdrawn with the lead 16. The lead 16 and cable 10 may be fed by a reciprocating automated feeder 56. In the embodiment as shown in FIG. 9, the dispensing of conformal coating 20 while still wet into nozzle 50 occurs so as to be applied to lead 16 previously disposed within counterbore 52. The conformal coating 20 as applied by the nozzle is performed in a manner to provide sufficient pressure to drive the conformal coating 20 into voids 24, or spaces 58 between strands 15 in lead 16. The driven conformal coating 20 disposed in voids 24 between strands 15 of lead 16 is best illustrated in FIG. 6. Once the cable lead 16 is withdrawn from counterbore 52, the crimping and curing steps as described above commence.

By sealing the electrical connection from electrolyte such as salt water, significant reduction of galvanic corrosion occurs between aluminum based cable and copper based electrical terminals. The displacement of the conformal coating 20 while it is still wet greatly enhances the structural sealing of the entire lead and aluminum based core while providing a sealed electrical interface and contact between the terminal and lead. The combination insulator and core wing also reduces exposure of the lead to the elements that can otherwise increase risk of electrolytic corrosion.

While the main application of this invention is for an interface between to two dissimilar metals, it is foreseen that application of this seal can also provide advantages for an interface between a terminal and lead made from similar or identical metals.

Other variations and modifications are possible without departing from the scope and spirit of the present invention as defined by the appended claims.

The embodiments in which an exclusive property or privilege is claimed are defined as follows.

The invention claimed is:

1. A method of forming a seal about a copper-based terminal and a cable having an insulative outer cover and an aluminum-based core, the method comprising the steps of:

providing a lead of said core extending beyond an axial edge of the insulative outer cover;

applying a conformal coating wet onto said lead, said lead being disposed into a counterbore of a nozzle and said wet conformal coating is dispensed into said nozzle and applied to said lead disposed within the counterbore;

crimping said copper-based terminal onto said lead while said applied conformal coating is still wet to displace the applied conformal coating from between said lead and said abutting contact surfaces of said copper-based terminal to provide electrical contact between said lead and said terminal and to cover and seal remaining portions of said lead not in direct contact with said terminal; and curing said applied conformal coating over said remaining portions of said lead.

2. A method as defined in claim 1 wherein the applying step further includes said nozzle being generally horizontally disposed and said lead being horizontally disposed into said horizontal nozzle so that said conformal coating is applied.

3. A method as defined in claim 1 wherein said core of said cable is made from a plurality of strands and said plurality of strands have spaces disposed therebetween, each strand being disposed between other strands in the plurality of strands by said spaces, and said wet conformal coating is dispensed by said nozzle and surroundingly applied to said lead disposed within said counterbore so that said conformal coating is driven with sufficient pressure in to at least said spaces of said lead so that said conformal coating fills said spaces.

4. A method as defined in claim 3 wherein said spaces are voids and said plurality of strands; and said when crimped, ensure at least the voids disposed in the lead are filled with said wet conformal coating before curing.

5. A method of forming a seal about a copper-based terminal and a cable having an insulative outer cover and an aluminum-based core, the method comprising the steps of:

providing a lead of said core extending beyond an axial edge of the insulative outer cover;

applying a conformal coating wet onto said lead;

crimping said copper-based terminal onto said lead while said conformal coating is still wet to displace the conformal coating from between said lead and said abutting contact surfaces of said copper-based terminal to provide electrical contact between said lead and said terminal and to cover and seal remaining portions of said lead not in direct contact with said terminal;

curing said conformal coating over said remaining portions of said lead;

applying the conformal coating is by dipping said lead into a nozzle; and dispensing said conformal coating into said nozzle while said lead is in said nozzle wherein said nozzle is generally horizontally disposed and said lead horizontally moves into said nozzle for dipping, wherein said aluminum-based core of said cable is made from a plurality of strands, and said strands, when crimped, have voids therebetween which are filled with said conformal coating is still wet before curing, wherein said terminal has a combination insulation and core wing that is crimped over said insulative outer cover and spans over an edge of said insulative outer cover and crimped onto said lead of said core.

6. A method of forming a seal about a copper-based terminal and a cable having an insulative outer cover and an aluminum-based core, the method comprising the steps of:

providing a lead of said core extending beyond an axial edge of the insulative outer cover;

applying a conformal coating wet onto said lead;

crimping said copper-based terminal onto said lead while said conformal coating is still wet to displace the conformal coating from between said lead and said abutting contact surfaces of said copper-based terminal to provide electrical contact between said lead and said terminal and to cover and seal remaining portions of said lead not in direct contact with said terminal; and curing said conformal coating over said remaining portions of said lead;

applying the conformal coating by dipping said lead into a nozzle; and dispensing said conformal coating into said nozzle while said lead is in said nozzle wherein said aluminum-based core of said cable is made from a plurality of strands, said strands having spaces therebetween and said conformal coating is dispensed with sufficient pressure to fill said spaces, wherein said terminal has a combination insulation and core wing that is crimped over said insulative outer cover and spans over an edge of said insulative outer cover and crimped onto said lead of said core.

7. A method of forming a seal between a terminal and a cable having an insulative outer cover and a core that is electrically conductive, the method comprising the steps of:

providing a lead of said core extending beyond an axial edge of said insulative outer cover;

applying a conformal coating wet onto said lead, said lead being disposed into a counterbore of a nozzle and said wet conformal coating is dispensed into said nozzle and applied to said lead disposed within said counterbore;

crimping said terminal onto said cable while said conformal coating is still wet to displace the conformal coating from between said lead and said abutting contact surfaces of said terminal and to cover and seal remaining portions of said lead not in direct contact with said terminal with said conformal coating; and curing said applied conformal coating over said remaining portions of said lead.

8. A method as defined in claim 7 wherein the applying step further includes said nozzle being generally horizontally disposed and said lead being horizontally disposed into said horizontal nozzle so that said conformal coating is applied.

9. A method as defined in claim 7 wherein said core of said cable is made from a plurality of strands, and said plurality of strands have spaces disposed therebetween, each strand being disposed between other strands in the plurality of strands by said spaces and said wet conformal coating is dispensed by said nozzle surroundingly applied to the lead within said counterbore so that said conformal coating is driven with sufficient pressure in to at least said spaces of said lead so that said conformal coating fills said spaces.

10. A method as defined in claim 9 wherein said spaces are voids and said plurality of strands, when crimped, ensure at least the voids disposed in the lead are filled with said wet conformal coating before curing.

11. A method as defined in claim 7 wherein the core is made from a material more electrically negative than said terminal when exposed to an electrolyte.

12. A method of forming a seal between a terminal and a cable having an insulative outer cover and a core that is electrically conductive, the method comprising the steps of:

providing a lead of said core extending beyond an axial edge of said insulative outer cover;

applying a conformal coating wet onto said lead;

crimping said terminal onto said cable while said conformal coating is still wet to displace the conformal coating from between said lead and said abutting contact surfaces of said terminal and to cover and seal remaining portions of said lead not in direct contact with said terminal with said conformal coating; and curing said conformal coating over said remaining portions of said lead, wherein said cable is made from a plurality of strands, said strands having spaces therebetween and said conformal coating is dispensed with sufficient pressure to fill said spaces, wherein said core of said cable is made from a plurality of strands, and said strands, when crimped, have voids therebetween which are filled with said conformal coating that is still wet before curing, and wherein said terminal has a combination insulation and core wing that is crimped over said insulative outer cover and spans over said edge of said insulative outer cover and crimped onto said lead of said core.

13. A method of forming a seal between a terminal and a cable having an insulative outer cover and a core that is electrically conductive, the method comprising the steps of:

providing a lead of said core extending beyond an axial edge of said insulative outer cover;

applying a conformal coating wet onto said lead;

crimping said terminal onto said cable while said conformal coating is still wet to displace the conformal coating from between said lead and said abutting contact surfaces of said terminal and to cover and seal remaining portions of said lead not in direct contact with said terminal with said conformal coating; and curing said conformal coating over said remaining portions of said lead, wherein said cable is made from a plurality of strands, said strands having spaces therebetween and said conformal coating is dispensed with sufficient pressure to fill said spaces, wherein said terminal has a combination insulation and core wing that is crimped over said insulative outer cover and spans over said edge of said insulative outer cover and crimped onto said lead of said core.

14. A method as defined in claim 13 wherein the core is made from a material more electrically negative than said terminal when exposed to an electrolyte.

15. A method of forming a seal about a copper-based terminal and a cable having an insulative outer cover and an aluminum-based core, the method comprising the steps of:

providing a lead of said core extending beyond an axial edge of the insulative outer cover;

applying a conformal coating wet onto said lead;

crimping said copper-based terminal onto said lead while said applied conformal coating is still wet to displace the applied conformal coating from between said lead and said abutting contact surfaces of said copper-based terminal to provide electrical contact between said lead and said terminal and to cover and seal remaining portions of said lead not in direct contact with said terminal; and curing said applied conformal coating over said remaining portions of said lead, wherein said terminal has a combination insulation and core wing that is crimped over said insulative outer cover and spans over said edge of said insulative outer cover and crimped onto said lead of said core.

16. A method of forming a seal between a terminal and a cable having an insulative outer cover surrounding an electrically conductive core, the method comprising the steps of:

providing a lead of said core extending beyond an axial edge of said insulative outer cover;

applying a conformal coating wet onto said lead;

crimping said terminal onto said cable while said conformal coating is still wet to displace the conformal coating from between said lead and said abutting contact surfaces of said terminal and to cover and seal remaining portions of said lead not in direct contact with said terminal with said conformal coating; and curing said applied conformal coating over said remaining portions of said lead, wherein said terminal has a combination insulation and core wing that is crimped over said insulative outer cover and spans over said edge of said insulative outer cover and crimped onto said lead of said core.

* * * * *